United States Patent [19]

Kelly-Mahaffey et al.

[11] Patent Number: 5,086,478
[45] Date of Patent: Feb. 4, 1992

[54] FINDING FIDUCIALS ON PRINTED CIRCUIT BOARDS TO SUB PIXEL ACCURACY

[75] Inventors: William L. Kelly-Mahaffey, Austin; James M. Stafford, Round Rock, Tex.

[73] Assignee: International Business Machines Corporation, Armonk, N.Y.

[21] Appl. No.: 634,642

[22] Filed: Dec. 27, 1990

[51] Int. Cl.$^5$ .............................................. G06K 9/00
[52] U.S. Cl. ........................................ 382/8; 382/22; 382/48; 358/101
[58] Field of Search ................. 382/8, 18, 22, 29, 48; 358/101, 107

[56] References Cited

U.S. PATENT DOCUMENTS

| | | | |
|---|---|---|---|
| 4,115,762 | 9/1978 | Akiyama et al. | 340/146.3 H |
| 4,441,206 | 4/1984 | Kuniyoshi et al. | 382/8 |
| 4,688,088 | 8/1987 | Hamazaki et al. | 358/101 |
| 4,860,374 | 8/1989 | Murakami et al. | 382/48 |

FOREIGN PATENT DOCUMENTS 0222860 11/1985 Japan .................................. 358/107

OTHER PUBLICATIONS

IBM Technical Disclosure Bulletin, vol. 31, No. 10, pp. 222-228, "Assembly Technique for Placing Electronic Components on Printed Circuit Wiring Patterns", Mar. 1989.
IBM Technical Disclosure Bulletin, vol. 32, No. 7, pp. 66-70, "Improved Low-Mass Vacuum Pickup Device with Z-Axis Compliance", Dec. 1989, U.S.A.
IBM Technical Disclosure Bulletin, vol. 30, No. 1, pp. 228-234, "Surface Mounted Device Placement", Jun. 1987, U.S.A.
IBM Technical Disclosure Bulletin, vol. 32, No. 8A, pp. 5-6, "Illumination System for Robot Placement/Assembly Robot", Jan. 1990, U.S.A.

Primary Examiner—Leo H. Boudreau
Assistant Examiner—Andrew W. Johns
Attorney, Agent, or Firm—Andrea P. Bryant

[57] ABSTRACT

A method is disclosed for determining the presence and position of fiducials on the surface of a printed circuit substrate in grey level images to sub-pixel accuracy. A summation profile technique is utilized to decrease the amount of computation required and thereby increase throughput for enabling real time operation in a total component placement system.

7 Claims, 5 Drawing Sheets

FINDING FIDUCIALS ON PRINTED CIRCUIT BOARDS TO SUB PIXEL ACCURACY

Cross Reference to Related Applications

This application is related to commonly assigned concurrently filed copending application Ser. No. 07/634,675.

BACKGROUND OF THE INVENTION

1. Field of the Invention

The present invention relates to computer vision techniques for locating objects in a field of view. More specifically it relates to finding locations on a substrate at which electronic components are to be placed and in controlling other hardware in a total placement system.

2. Description of the Prior Art

Great accuracy is required in placing electronic components on printed circuit substrates for subsequent bonding thereto. This requirement for accuracy is particularly significant when extremely fine pitch components are to be placed. It is known in the prior art to utilize computer vision techniques for such placement. However, it is conventional to perform extensive manipulation of all pixels in a camera field of view to achieve accuracy when placing surface mountable components.

A fiducial is a piece of artwork on a printed circuit substrate whose distance from all other artwork is known. Since a fiducial can be located automatically within an image by means of a vision system, the image of the fiducial space coordinates may be mapped to real world coordinates for allowing automatic derivation of real world coordinates for other parts of the substrate artwork. This information is used for controlling a robot and other motive means for manipulating a printed circuit board and the components should be placed thereon.

It is known to find objects within an image using grey level techniques but extensive manipulation of all pixels in the search window is traditionally necessary. Some increase in processing time may be achieved by embedding primitive operations in hardware. However, such an arrangement alters the scale of timings only, not their order. In either hardware or software the order of search is $N \times N$, i.e. two dimensional.

These techniques for finding fiducials as part of the process for aligning components accurately on placement sites are described in the literature. IBM Technical Disclosure Bulletin Volume 31, Number 10, March 1989, p. 222 "Assembly Technique for Placing Electronic Components on Printed Circuit Wiring Patterns" discloses the use of vision techniques for calibrating a printed circuit board to the robot coordinate system using a camera and fiducials on the board as well as footprint fiducials.

IBM Technical Disclosure Bulletin Volume 32, Number 7, December 1989, p. 66 "Improved Low Mass Vacuum Pickup Device with Z-Access Compliance" also discloses the use of a vision system for viewing board fiducials at the component footprint in preparation for a surface mount component placement.

IBM Technical Disclosure Bulletin Volume 30, Number 1, June 1987, p. 228 "Surface Mounted Device Placement" similarly discloses the use of computer vision and locating board fiducials for accurate component placement.

IBM Technical Disclosure Bulletin Volume 32, Number 8A, January 1990, p. 5 "Illumination System for Robot Placement/Assembly Robot" relates to the use of vision techniques and determining fiducial mark location prior to component placement. It is desirable to use vision processing to locate fiducials with the highest possible degree of accuracy while minimizing the amount of time and computational resources required.

SUMMARY OF THE INVENTION

The present invention represents an improvement over the prior art by simplifying the process for or finding fiducials. The present invention utilizes summation profiles for finding fiducials on a printed circuit board which leads to a great reduction in the amount of pixel data to be analyzed.

As is frequently the case, fiducials are circular in configuration and the present invention takes advantage of the symmetry of circular and convex polygonal fiducials for reducing the two-dimensional information in a search window to two one-dimensional summation profiles which abstracted represent the average value of pixels along rows and columns in the search window.

A camera captures gray level images which are digitized and stored in an array of pixel values in system memory. Summation data is obtained by summing all pixels in each row and column.

Then the edges of the fiducial in the two one-dimensional profiles are found and ordered to determine the approximate center of the fiducial. After the approximate center is found, a similar method of edge detection is performed on rows and columns of pixels in the neighborhood of the approximate center in order to determine the center to sub-pixel accuracy.

Thus, $N \times N$ computation is restricted to producing summation profiles which can be quickly processed since more complex processing is of the order N. Summation profiles enable the finding of the approximate center of a fiducial and the approximate center is used to locate a very small order subset of two dimensional data which is processed to find the center of the fiducial to sub-pixel accuracy.

Once the center of a fiducial is found to sub-pixel accuracy, that information is passed to downstream system controls in a conventional manner. e.g., for guiding robotic placement of a component.

BRIEF DESCRIPTION OF THE DRAWING

The above and other features and advantages of the present invention will be described more fully in connection with the following drawing in which.

DESCRIPTION OF THE PREFERRED EMBODIMENT

Figure 1:
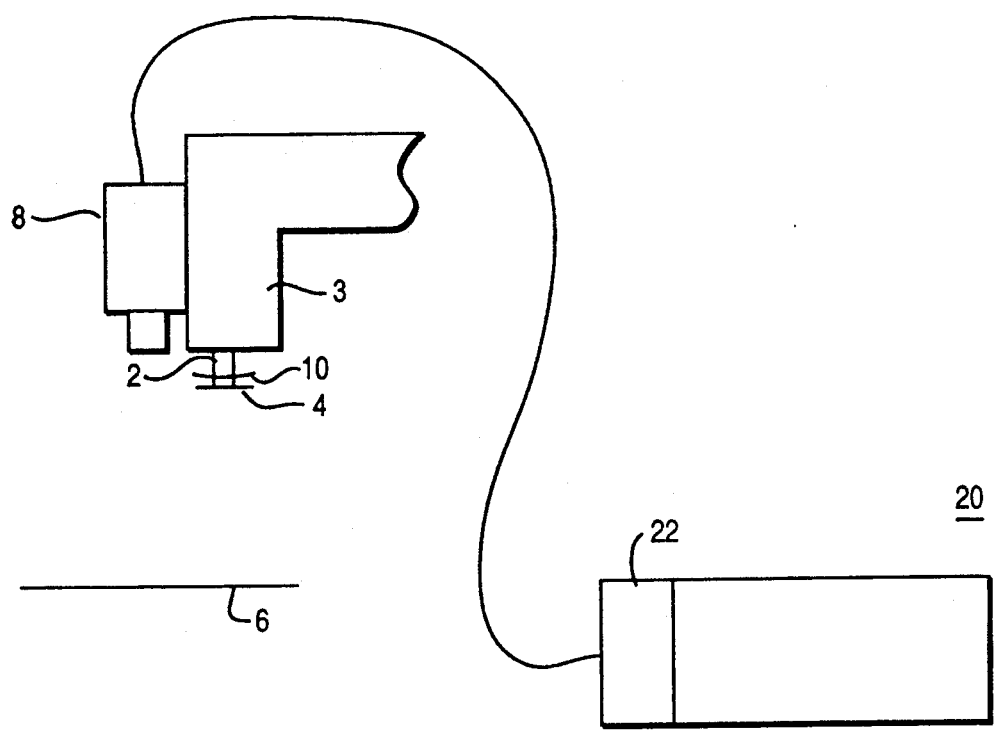
FIG. 1 is the schematic diagram of a placement system in which the present invention is embodied.

Refer now to FIG. 1. Robot arm 2 includes an end effector 3 for carrying a component 4 to be placed on substrate 6. Camera 8 is borne on robot end effector 3 so as to look downwardly at substrate 6. Camera 8 may be a 480×512 sensor array for obtaining gray level pixel data. A circular light source 10 is mounted on a robot end effector 2 also for illuminating substrate 6.

Vision processor 20 includes a frame grabber 22 for accepting analog input from camera 8, converting the data to digital and storing it. We show frame grabber 22 for illustrative purposes but any apparatus for acquiring digitized gray level image data is suitable.

Figure 2:
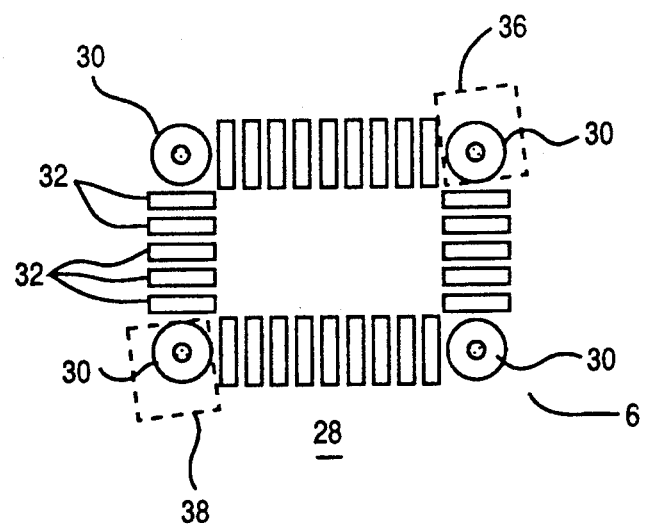
FIG. 2 is a plan view of a portion of the surface of the circuitized substrate.

FIG. 2 shows a component 28 site and fiducials 30 on the surface of printed circuit substrate 6. Metalized pads to which leads of a surface mount component will be mounted are illustrated generally at 32. As is understood in the art, apparatus calibration procedures include establishing the number of pixels per millimeter in both the X and Y directions. Substrate artwork specifications are also known so that predetermination of a search window for camera 8 is facilitated. Such a window is represented generally at 36 and 38. Determination of presence and location of the fiducials located with search windows 36 and 38 provides sufficient information for controlling placement apparatus.

The method of the present invention includes two phases. In the first, the presence/absence of a fiducial is determined and if present, the approximate center of the fiducial is determined. In the second phase of the inventive technique the location of the approximate center of the fiducial is used in finding the center of the fiducial to sub-pixel accuracy.

Figure 3:
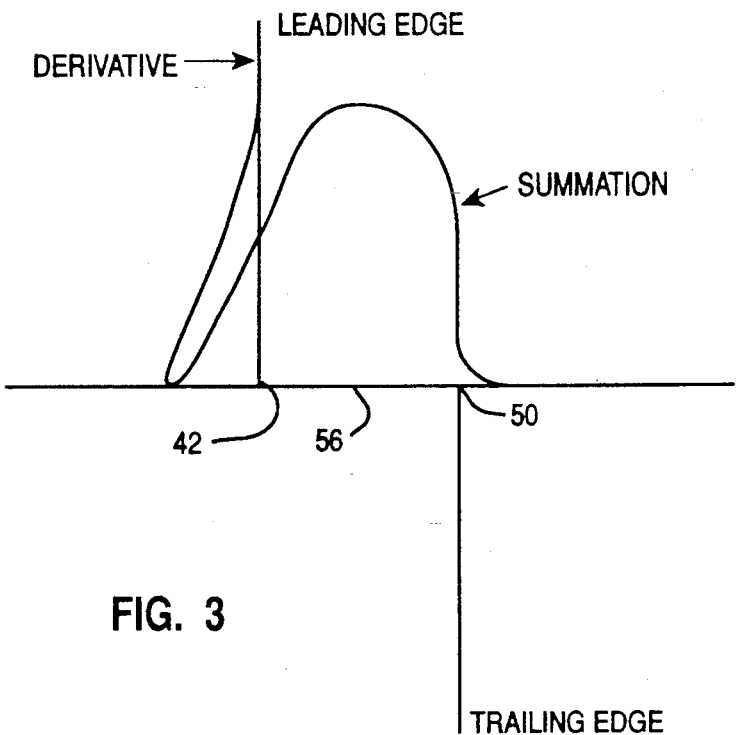
FIG. 3 shows an idealized summation profile.

Summation profiles of the search window are taken in the x and y directions. First differences are obtained by subtracting adjacent valleys from adjacent peaks in the profiles. High and low first differences in the profiles are deemed to correspond to the leading and trailing edges of the fiducial. FIG. 3 is an idealized summation profile for a fiducial 30. Leading edge 42 is easily found by taking the high first difference that is the largest positive difference between two peaks. Similarly trailing edge 50 is found by the low first and center point 56 is the midpoint therebetween. We take first differences as a digital implementation of finding the first derivative. In the event that the window may be cluttered by objects other than the fiducial, first differences are screened to find the best match with the fiducial diameter. In our illustrative embodiment, the fiducial is rejected if not exactly one potential match for the diameter is found.

The surface mount component to be placed is a TAB device having leads with dimensions in the 40 to 12 mil range. Fiducial size for leads in this range is typically 0.040 in. Our screening parameters are chosen based upon the expected contrast between the fiducial and the printed circuit board surface. However those having skill in the art will realize that other screening parameters corresponding to different printed circuit board/fiducial contrast values may be utilized.

Figure 4:
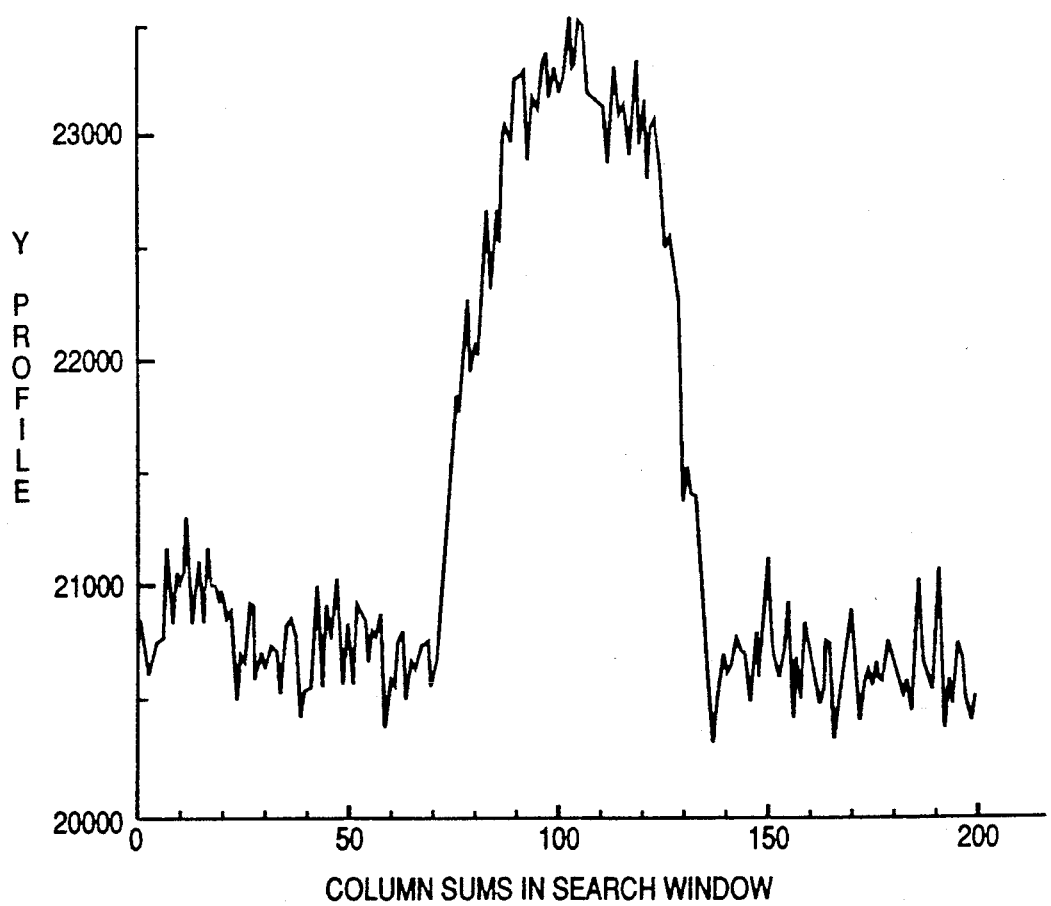
FIG. 4 shows a summation profile.

Refer now to FIG. 4 which is a summation profile for a typical fiducial in the Y direction. It should be noted that though not shown a corresponding summation profile in the X direction would look very much like FIG. 4.

Figure 5:
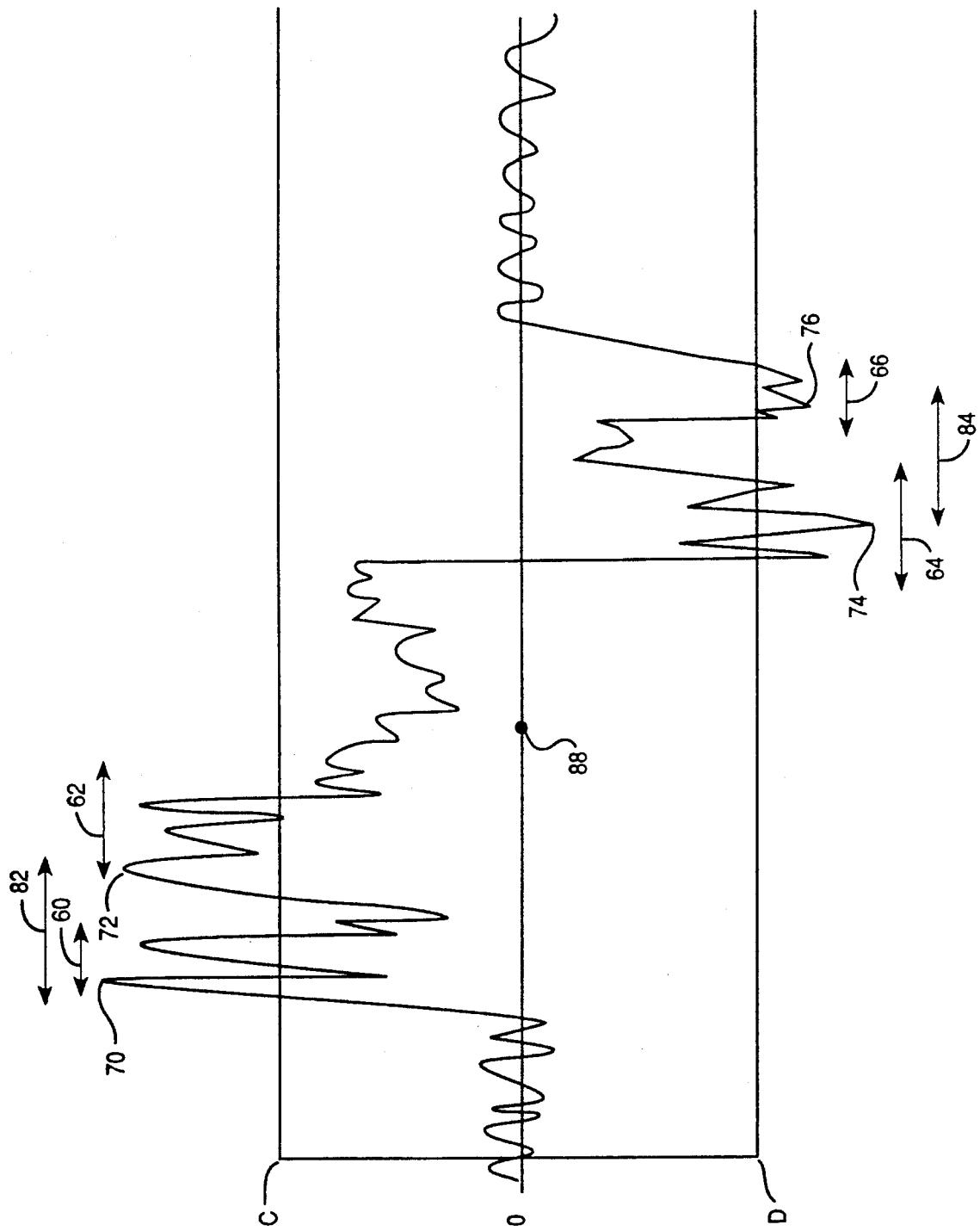
FIG. 5 graphically illustrates screening for finding fiducial edges.

FIG. 5 is a graph of the first differences of a summation profile, first difference profile, such as that shown in FIG. 4. Our screening parameters have been selected as 1.85 sigma from the mean. Lines C and D represent the upper and lower screening levels.

High values are those greater than 1.85 sigma from the mean. If no peaks meet this criterion, then the maximum peak is chosen. Similarly. low values are those less than $-1.85$ sigma from the mean or the minimum value peak if it is greater than $-1.85$ sigma from the mean.

For contiguous runs 60, 62 of high values and 64. 66 of low values meeting these criteria. the maximum value among highs and the minimum value among lows are chosen as shown at 70, 72 and 74, 76.

All combinations of chosen high and lows whose distance apart is within one-quarter of the expected fiducial diameter as represented by arrows 82, 84 of a fiducial are selected. In this case, high peaks 70 and 72 and low peaks 74 and 76 meet these criteria.

Any pairs of combinations for which both the leading and trailing edges of the two pairs are no further apart than one-quarter of the diameter of the fiducial are assumed to be the same candidate and the pair whose size is closest to the expected diameter is selected.

If after the above screenings have been applied. not exactly one candidate pair of high and low peaks remain, then the fiducial is deemed absent and rejected. When exactly one candidate is found, its approximate center is deemed to be half way between the two peak valley pairs as shown at 88 in FIG. 5.

In the next phase of processing, the x, y coordinates of the exact center of the fiducial are found. Small arrays of pixels from frame grabber 22 are examined. First, n rows of pixels centered at the approximate y location are considered in order to find the x coordinate.

Figure 6:
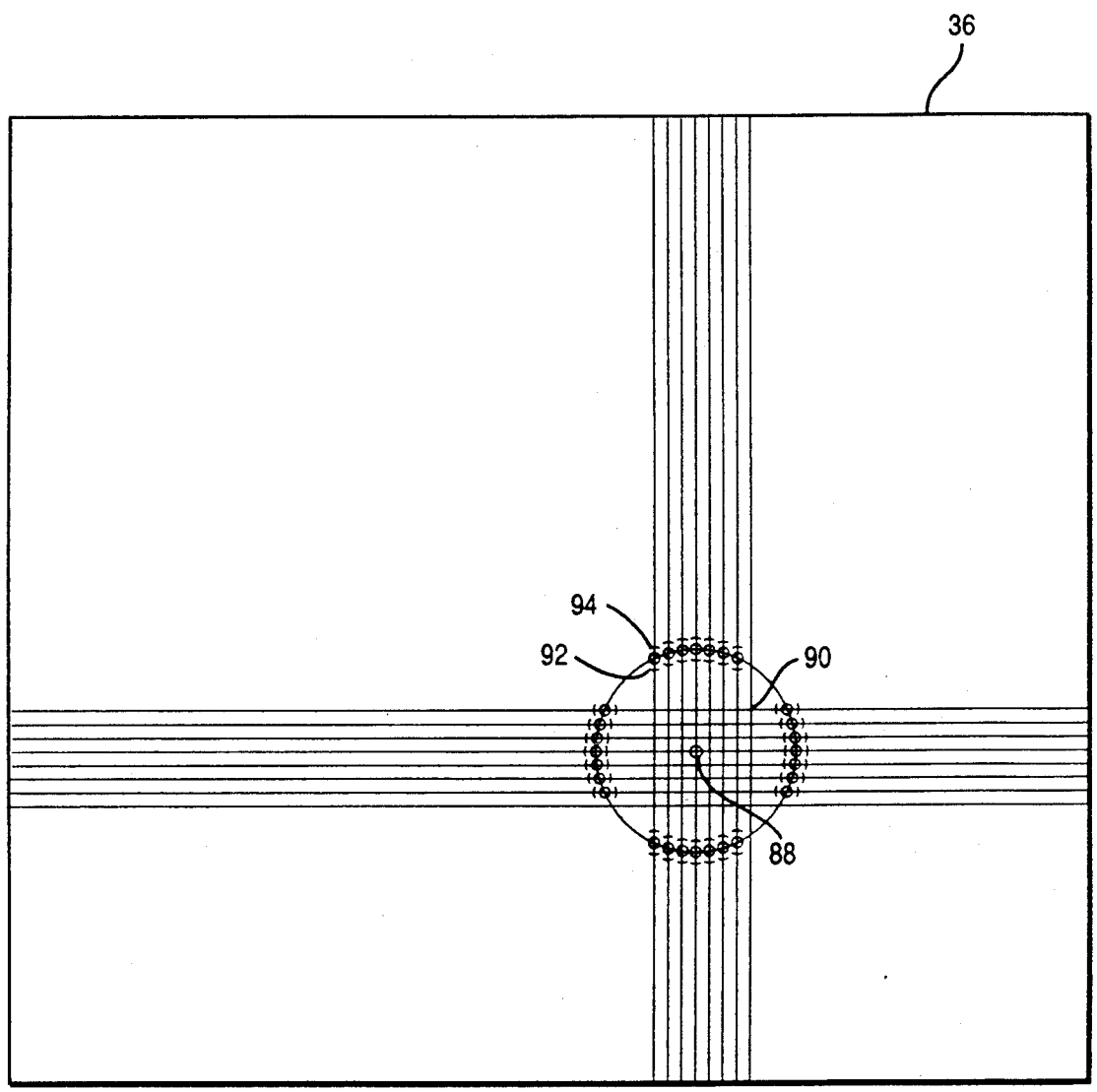
FIG. 6 graphically illustrates finding the exact center of a fiducial.

In our illustrative embodiment seven (7) rows and columns surrounding the approximate center of the fiducial are considered as shown in FIG. 6 at 90. Bounding concentric arcs 92 and 94 are computed by measuring from 0.75 to 1.25 times fiducial radius, in that direction, on both sides of the approximate X and Y center. Thus the amount of two dimensional data to be retrieved from frame grabber 22, FIG. 1, is extremely small.

Once the pixel data is retrieved. first differences are taken by subtracting adjacent values along each row or column, then using the first differences so calculated, edges within those ranges are determined.

The boundaries of the fiducial whose center is halfway in between are determined. The average of the centers found in this manner is the value of the x coordinate of the center of fiducial 30 in FIG. 2 to sub-pixel accuracy.

In a similar manner, the y coordinate of the exact center is determined. First differences along each column in the bounding arcs described at points 0.75 to 1.25 times the known radius of the fiducial on both sides of the approximate y center are taken. Again, using first those differences enables the edges within those ranges are found.

Figure 7:
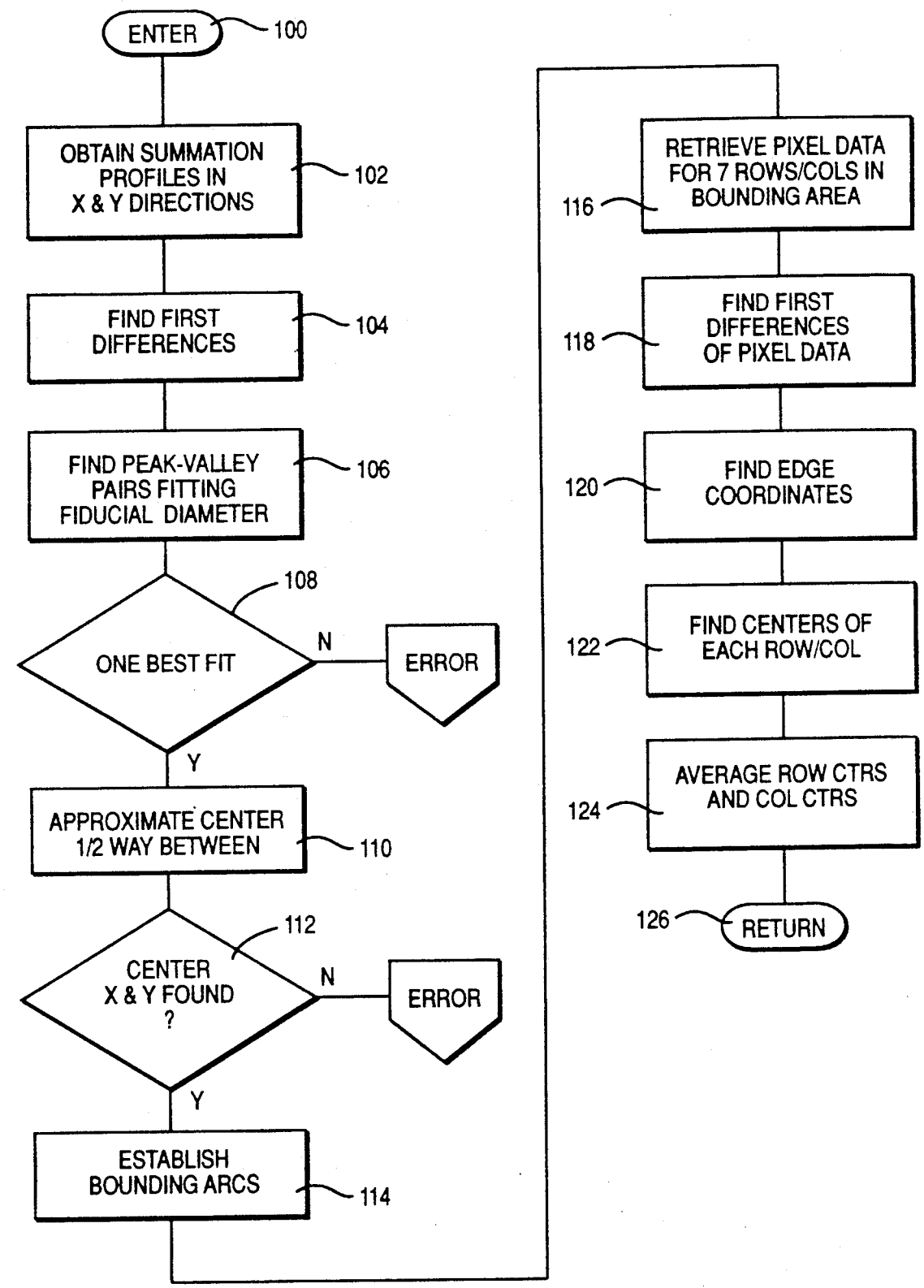
FIG. 7 is a flowchart describing the logic performed in finding fiducial centers.

Refer now to FIG. 7 which is a flow chart of logic followed in vision processor 20. Logic is entered at terminal 100 once digitized pixel data from window 36 is stored. At block 102, summation profiles in both X and Y are taken, that is within the area of interest all of the pixel values in rows are summed and all of the pixel values in the columns are summed to yield two one dimensional arrays.

First differences are found at block 104 by subtracting adjacent valleys from adjacent peaks. Then, the first differences so found are screened to yield peak-valley pairs prior to comparing the peak valley pairs with known fiducial X and Y diameters and finding the best match. If no best match is found at block 108 an error condition is returned, otherwise as indicated, the approximate center is then calculated at block 110 by choosing the point halfway between the peak-valley pair chosen.

As will be recalled, it is necessary to find both X and Y summation profiles so that at decision point 112 if not both an X and Y have been found, an error condition is returned.

When the X, Y coordinates of the center have been successfully found, the logic is ready to begin finding the X, Y coordinates exact center of the fiducial to sub-pixel accuracy. As a first step in that process as indicated at block 114, two concentric bounding arcs are established. An inner bounding arc is established 0.75 radius in the appropriate direction on either side of the approximate center found above. The outer bounding arc is 1.25 radii from the approximate center in both directions. Since that pixels are not always square, our bounding arcs may not describe two concentric circles.

To this point all calculations have been performed on the one dimensional summation profiles due to the benefit in throughput achieved by minimizing the number of calculations to be performed. While our process for finding exact center requires manipulation of two dimensional arrays, they are very, very small. being the pixels within the concentric bounding arcs at the four locations shown in FIG. 6. Thus at block 116 those pixel arrays are retrieved from frame grabber 22 in FIG. 1. At block 118 first differences are taken. This action is followed by finding the edge coordinates within the first differences in block 120. For each row or column a center is calculated at block 122; and at block 124 all row centers are averaged and all column centers are averaged to provide the exact center.

Two kinds of fiducials can be handled by simple profile methods. The first is a fiducial which has been shaved during the cleaning process. This causes its edge to to appear as a ramp in the image. since the entire ramp causes responses in the first derivative, the pixel which is furthermost from the center of the fiducial and closest to the background in intensity is located as the edge of the fiducial. The second type of fiducial is unabraded, which creates a very sharp edge in its profile. Here the strongest response in the first derivative is the location of the edge.

Differentials in etching and similar processes cause some fiducials to appear as two concentric circles resembling a dime stacked on a nickel. Empirically, we have discovered that the smaller inner circle s edge produces a response in the first derivative which is approximately 2× that of the outer circle. To find the edge of the fiducial, the inner circle's edge is found first, and then first derivative responses are searched for towards the outside until they fall below 45% of that of the inner circle.

What follows is a Pseudo code description of our technique for finding exact center of fiducials.

Block O: Find Fiducial if the fiducial is in the region of interest:
then
   Block 1—Find the approximate center of the fiducial.
if the approximate center is found:
then
   Block 2—Find the center to sub-pixel accuracy Block 1: Find the Approximate Center of the Fiducial Iteratively find the approximate center, first in the Y direction. second in the X direction:
   Obtain a summation profile in this direction.
   Find first differences of the summation profile.
   Using the first differences:
      Block 1A—find the left and right margins of the fiducial profile.
   if exactly one pair of left and right margins fitting the fiducial diameter in this direction is found: then
      The approximate center of the fiducial is halfway between the margins.
   Else the fiducial does not exist.

Block 1A: Find the Left and Right Margins of the Fiducial Profile

Find the average, sigma, maximum, and minimum of the first differences.
Using the average, sigma, maximum, and minimum, determine the screening envelope of differences to be considered. Excluding peaks and valleys of the first differences which are inside the screening envelope:
   Block 1A1—find candidates for leading and right margins of the fiducial.
if any candidates are found:
From the candidates found:
   Block 1A2—find exactly one pair of left and right margins whose distance apart is:
      closest to the size of the expected diameter
      within $+\frac{1}{4}$ of the expected diameter.
if not exactly one pair is found
then
   The left and right margins do not exist.

Block 1A1: Find Candidates for Left and Right Margins of the Fiducial Profile iteratively examine each first difference:
   if a first difference value is outside the screening envelope:
   then
      Find all first differences which are outside the envelope and connected through a chain of immediate adjacencies.
   if the fiducial is lighter than its background:
   then
      For left margins, the maximum value of such a chain is a candidate.
      For right margins, the minimum value of such a chain is a candidate.
   else
      For left margins, the minimum value of such a chain is a candidate.
      For right margins, the maximum value of such a chain is a candidate.

Block 1A2: Find Exactly One Pair of Left and Right Marqins iteratively examine all pairs <a,b> of the set of left margin candidates, (lmc), and the set of right margin candidates, (rmc), where a is an element of lmc and b is an element of rmc:
if the distance between a and b, (dis(a,b)),
is >
   0.75 expected diameter
   and
   dis(a,b) <1.25 expected diameter:
then add <a,b> to the set of chosen pairs.
C. (C=C+{<a,b>})
From the set of chosen pairs, C exclude equivalent pairs:
for all pairs of left and right margins <a,b> in the set of chosen pairs C. compare <a,b> with all pairs of left and right margins <c,d> in the set (C−{<a,b>}).
where a and c are left margins and b and d are right margins:
   if dis(a,c) <¼ expected diameter and
   dis(b,d) <¼ expected diameter
   then
       <a,b> is equivalent to <c,d>
       if (expected diameter - dis(a,b)) <
       (expected diameter - dis(c,d))
       then
           <a,b> is a better fit to the
           expected diameter than <c,d>
           discard <c,d>: C=C−{<c,d>}
       else
           <c,d> is a better fit to the
           expected diameter than <a,b>
           discard <a,b>: C=C−{<a,b>}
   if after completion of the above iteration. exactly one pair <a,b> in the set C:
   then
       a is the left margin of the fiducial profile.
       b is the right margin of the fiducial profile.
   else
       The left and right margins of the fiducial profile do not exist.

Block: 2 Find the Center to Sub-pixel Accuracy

Iteratively find the center to sub-pixel accuracy, first in the Y direction. second in the X direction:
Determine the ranges of pixels to be searched for the left/top and right/bottom edges of the fiducial:
   Left/top range is:
       approximate center−1.25 radii to
       approximate center−0.75 radius
   Right/bottom range is:
       approximate center +0.75 radius to
       approximate center +1.25 radii
   if finding the Y center:
   then
       Iteratively treat columns from −n to +n about the X approximate center:
   else finding the Y center:
   then
       iteratively treat columns from −n to +n about the X approximate center:
   else finding the X center:
       iteratively treat rows from −n to +n about the Y approximate center:
       Read the pixels in a row or column.
For purposes of this description. the number of rows of columns to be examined for sub-pixel accuracy is RC and n=integer part of RC/2. In examining RC rows, we look at n rows above the approximate center row, n rows below the approximate center row, and the approximate center row. (RC rows−n rows above+n rows below+approximate center row=2n+1) In this preferred embodiment RC =7 as described in connection with FIG. 6. Columns are handled likewise.
Take the differences within the determined ranges.

Using the first differences. find the left/top and right/bottom edge coordinates.
The center of the fiducial within the row or column profile is half way in between the two edge coordinates.
The center to sub-pixel accuracy is the average of the 2n+1 row or column centers.

While the subject invention has been described having reference to a particular preferred embodiment. various changes including those above mentioned in form and detail may be made without departing from the spirit and scope of the invention as claimed.

We claim:

1. A method for locating a circular or symmetrical convex polygonal fiducial of known dimensions on a circuitized substrate comprising the steps of:
   determining fiducial presence by;
       acquiring a two dimensional digitized image array;
       selecting a subarray representing a predetermined area within which a fiducial is expected;
       calculatimg summation profiles of rows and columns in said selected subarray;
       constructing a first difference profile corresponding to each calculated summation profile; and
       screening said first difference profiles for choosing presumptive leading and trailing edges of the fiducial; finding approximate fiducial center by taking midpoints between presumptive leading edges and trailing edges; and calculating fiducial center to sub pixel accuracy by selecting from said two dimensional array of digitized image data, four two dimensional subarrays located a predetermined distance on either side of the X and Y coordinates found in said fining step;
       determining first differences for each of said four subarrays;
       choosing maximum and minimum values for X from said firt differences from subarrays located on either side of the X value found in said finding step;
       choosing maximum and minimum values for Y first differences from said subarrays on either side of the Y value found in said finding step; and
       averaging chosen values for X and Y, respectively, to find exact X and Y values.

2. The method of claim 1 wherein said screening step further includes:
   repeatedly compairing pairs of plus and minus peaks from first differences of said summation profiles for obtaining candidate peak valley pairs separated by a distance within one fourth of expected fiducial radius dimension;
   picking from said condidate peak-valley pairs of pair whose distance apart most closely matches expected fiducial diameter dimension.

3. The method of claim 1 wherein said selecting from said two dimensional array step additionally includes:
   examining seven rows of pixels centered about X coordinate of approximate center;
   retrieiving pixel data along each row from 0.75 to 1.25 fiducial radius distance and from −1.25 to −0.75 radius disance from X;
   examininmg 7 columns of pixels centered about Y coordinate of apprxoimate center; and
   retrieving pixel data along each column from 0.75 to 1.25 radius distance and from −1.25 to −0.75 radius distance from Y.

4. A method of locating a fiducial center to sub pixel accuracy comprising the steps of:
  finding leading and trailing edges and apprxoimate center coordinates through analysis of one dimensional first differences of summation profile arrays, said finding step including;
  obtaining a digitized image array of whole scene;
  examining a predetermined two dimensional subarray wherein object is expected;
  forming one dimensional summation profiles for rows and columns of pixels in said subarray;
  calculating row summations of pixel values in said subarray for structuring a one dimensional profile array;
  calculating column summations of pixel values in said subarray for structuring a one dimensional profile array;
  assuming leading edge of the object to correspond to a high positive difference and trailing edge to correspond to a low negative difference in each on dimensional profile array;
  establishing approximate X, Y center coordinates, at points midway between said high and low differences;
  determining exact center coordinates through analysis of four narrowly constrained, two dimensional pixel arrays whose locations are chosen as a function of distance from approximate center coordinates, said determining step including;
  examining four subarrays of pixel data selected as a function of their location in relation to established apprxoimate X, Y center coordinates;
  finding first differences in each subarray; and
  averaging maximum and minimum values in each subarray.

5. A method of precisely locating an object in a field of view comprising the steps of:
  obtaining a digitized image array of a whole scene in the field of view;
  examining a predetermined two dimensional subarray of said digitized image array wherein an object is expected;
  forming one dimensional summation profiles for rows and columns of pixels in said subarray by calculating row summations of pixel values in said subarray for structuring a one dimensional profile array, and calculating column summations of pixel values in said subarray for structuring a one dimensional profile array;
  assuming the object's leading edge to correspond to a high positive difference and its trailing edge to correspond to a low negative difference in each one dimensional profile array;
  establishing approximate X, Y center coordinates, at points midway between said high and low differences;
  examining four subarrays of pixel data selected as a function of their location in relation to established approximate X, Y center coordinates;
  finding first differences in each subarray; and
  averaging maximum and minimum values in each subarray.

6. The method of claim 5, including the additional step of finding object center to sub pixel accuracy comprising:
  establishing 2 pairs of concentric bounding arcs about coordinates of approximate object center as a function of distance therefrom;
  finding first differences in pixel data within said concentric bounding arcs; and
  averaging maximum and minimum first difference values within concentric bounding arc pairs.

7. The method of claim 3 including the additional steps of:
  examining four subarrays of pixel data selected as a function of their location in relation to established approximate X, Y center coordinates;
  finding first differences in each subarray; and
  averaging maximum and minimum values in each subarray.

* * * * *

UNITED STATES PATENT AND TRADEMARK OFFICE
CERTIFICATE OF CORRECTION

PATENT NO.   :   5,086,478

DATED        :   February 4, 1992

INVENTOR(S)  :   William L. Kelly-Mahaffey and James M. Stafford

It is certified that error appears in the above-identified patent and that said Letters Patent is hereby corrected as shown below:

Col. 8, line 34, please delete "fining" and insert --finding--;
      line 38, please delete "firt" and insert --first--;
      line 48, please delete "compairing" and insert --comparing--;
      line 53, please delete "condidate" and insert --candidate--;
              please delete "of" and insert --one--;
      line 63, please delete "examininmg" and insert --examining--; and
Col. 9, line 22, please delete "on" and insert --one--.

Signed and Sealed this

Eleventh Day of May, 1993

Attest:

MICHAEL K. KIRK

*Attesting Officer*   *Acting Commissioner of Patents and Trademarks*